United States Patent
Lin et al.

(10) Patent No.: US 6,664,177 B1
(45) Date of Patent: Dec. 16, 2003

(54) DIELECTRIC ARC SCHEME TO IMPROVE PHOTO WINDOW IN DUAL DAMASCENE PROCESS

(75) Inventors: Kwang-Ming Lin, Hsin-Chu (TW); Chung-Hung Lu, Win Lin County (TW); Szu-An Wu, Hsin-Chu (TW); Ya-Li Tai, Tao-Yuan (TW); Kun-Yi Liu, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 147 days.

(21) Appl. No.: 10/062,645

(22) Filed: Feb. 1, 2002

(51) Int. Cl.$^7$ .......................................... H01L 21/4763
(52) U.S. Cl. ....................................................... 438/624
(58) Field of Search ................................ 438/622, 623, 438/618, 634, 636, 637, 687, 631; 430/312, 313, 314, 316

(56) References Cited

U.S. PATENT DOCUMENTS

| 5,639,687 | A |   | 6/1997 | Roman et al. ............... 437/186 |
|---|---|---|---|---|
| 6,037,276 | A |   | 3/2000 | Lin et al. .................... 438/786 |
| 6,042,999 | A | * | 3/2000 | Lin et al. .................... 430/316 |
| 6,060,380 | A |   | 5/2000 | Subramanian et al. ....... 438/618 |
| 6,100,559 | A |   | 8/2000 | Park ............................ 257/315 |
| 6,214,721 | B1 |  | 4/2001 | Bendik, Jr. et al. ......... 438/624 |

* cited by examiner

*Primary Examiner*—Kamand Cuneo
*Assistant Examiner*—Monica D. Harrison
(74) *Attorney, Agent, or Firm*—George O. Saile; Stephen B. Ackerman

(57) ABSTRACT

This invention relates to a method of fabrication used for semiconductor integrated circuit devices, and more specifically, to improve the photolithography processing window of a multi-layered dual damascene process by using a dielectric anti-reflective coating, DARC, comprised of multiple layers of silicon oxynitride, SiON, with varying k, dielectric constant values and thickness, to reduce reflectivity and improve light absorption. By varying both the thickness and the dielectric constant of the layers, the optical properties of light absorption, refractive indices, and light reflection are optimized.

31 Claims, 1 Drawing Sheet

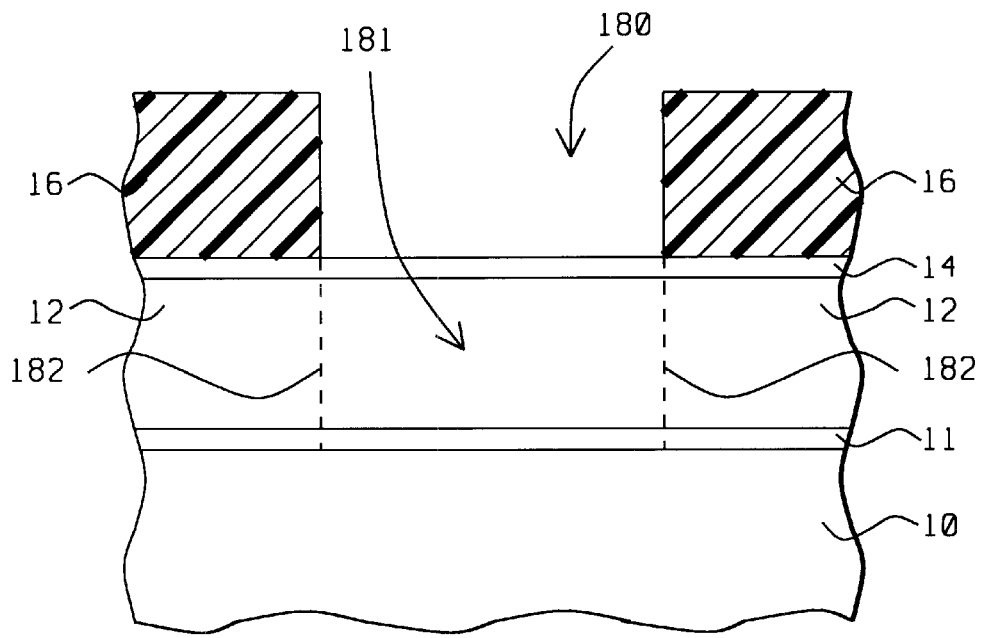
FIG. 1 — Prior Art
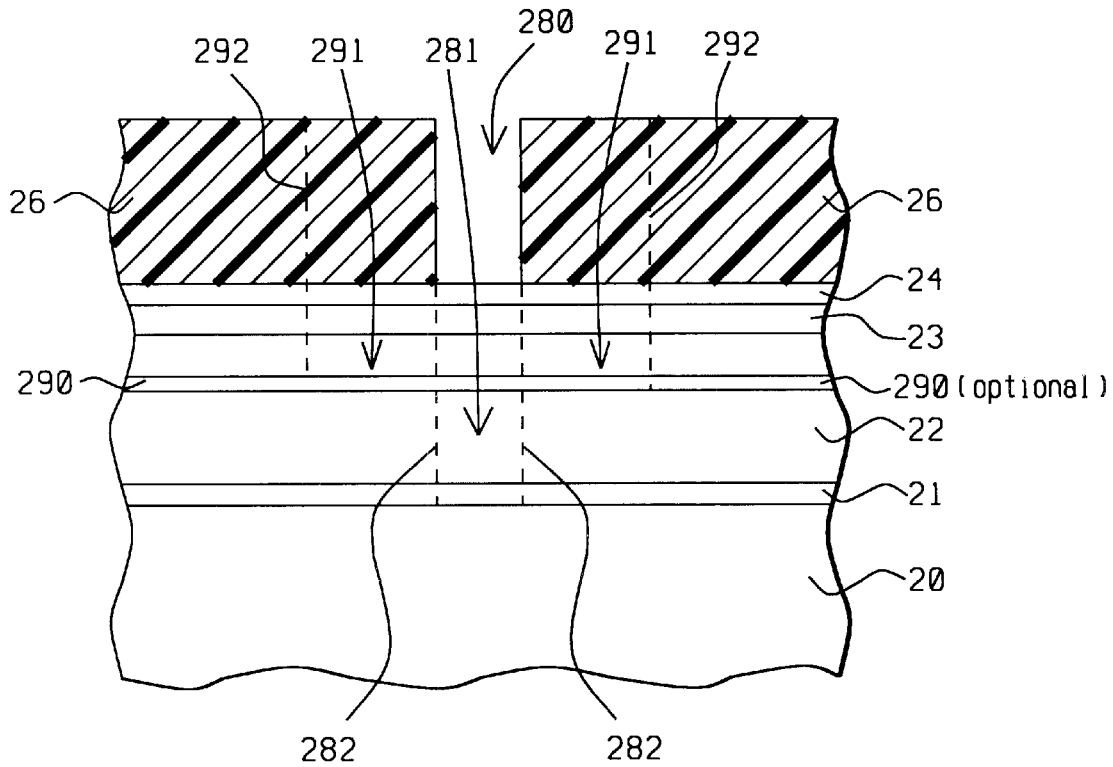
FIG. 2

US 6,664,177 B1

DIELECTRIC ARC SCHEME TO IMPROVE PHOTO WINDOW IN DUAL DAMASCENE PROCESS

BACKGROUND OF THE INVENTION (1) Field of the Invention

This invention relates to a method of fabrication used for semiconductor integrated circuit devices, and more specifically, to improve the photolithography processing window of a multi-layered dual damascene process by using a dielectric anti-reflection coating, DARC, comprised of multiple layers of SiON with varying k, dielectric constant values and thickness, to reduce reflectivity and improve light absorption.

(2) Description of Related Art

As a background to the current invention, it remains a challenge in dual damascene processing to improve the photolithography processing window in a multi-layered dual damascene process by using ARC, anti-reflection coatings, to reduce reflectivity and improve light absorption, to minimized light scattering back from the underlying substrate. One solution is to use a fairly thick layer of SiON as an ARC; but, this method has a significant problem in that the thick SiON film causes defects in a subsequent Ar sputtering process, which in turn leads to yield loss.

The related Prior Art background patents will now be described in this section.

U.S. Pat. No. 6,214,721 entitled "Method and Structure for Suppressing Light Reflections During Photolithography Exposure Steps in Processing Integrated Circuit Structures" granted Apr. 10, 2001 to Bendik, Jr. et al. describes a method for forming dual damascene patterns using a dual ARC, anti-reflection coating process. The dual ARC process incorporates "built-in" wave dampening by having one or more silicon nitride layers remain, as part of a dual damascene "stack" of material layers.

U.S. Pat. No. 6,100,559 entitled "Multipurpose Graded Silicon Oxynitride Cap Layer" granted Aug. 8, 2000 to Park teaches a photolithography process using a graded thin SiON layer, as an anti-reflective coating (ARC) and is graded with varying concentrations of nitrogen.

U.S. Pat. No. 6,060,380 entitled "Anti-reflection Silicon oxynitride Hardmask Layer Used During Etching Processes In Integrated Circuit Fabrication" granted May 9, 2000 to Subramanian et al. describes a method of forming dual damascene trench lines and vias holes using a low reflectivity silicon oxynitride hardmask layer with a photoresist layer over the hardmask layer. After exposure to light, the photoresist layer is patterned more conformally to a desired pattern.

U.S. Pat. No. 6,037,276 entitled "Method for Improving Pattering of a Conductive Layer in an Integrated Circuit" granted Mar. 14, 2000 to Lin et al. discloses a process to pattern a conductive layer using an anti-reflective coating. The process uses a dual cap of oxynitride and silicon nitride, with the oxynitride layer performing as a bottom anti-reflection coating to improve photolithography process performance.

U.S. Pat. No. 5,639,687 entitled "Method for Forming an Integrated Circuit Pattern on a Semiconductor Substrate Using Silicon-Rich Silicon Nitride" granted Jun. 17, 1997 to Roman et al. teaches a photolithography process to pattern an underlying layer using an anti-reflective coating. The process uses a cap layer of silicon-rich silicon nitride which forms an anti-reflection coating over the photoresist, to improve photolithography process performance.

SUMMARY OF THE INVENTION

This invention relates to a method of fabrication used for semiconductor integrated circuit devices, and more specifically, to improve the photolithography processing window of in a multi-layered dual damascene process by using a dielectric anti-reflection coating, DARC, comprised of multiple layers of SiON with varying k, dielectric constant values and thickness, to reduce reflectivity and improve light absorption. By varying both the thickness and the dielectric constant of the layers, the optical properties of light absorption, refractive indices, and light reflection are optimized.

Key to the present invention is a multi-layer film scheme for a dielectric anti-reflective coating, DARC, comprised of firstly a bottom layer of silicon oxynitride, SiON, is deposited an intermetal dielectric and the SiON has a dielectric constant k value from approximately 1.0 to 1.4, with the layer thickness from approximately 300 to 500 Angstroms. This bottom layer performs as a light absorption layer to minimize light scattering back from the substrate. Secondly, the multi-layer anti-reflective coating is comprised of a top layer of silicon oxynitride, SiON, deposited over the bottom layer of SiON, and the top SiON has a dielectric constant k value from approximately 0.3 to 0.6, with a layer thickness from approximately 200 to 500 Angstroms. This top layer performs as a phase cancellation layer to destructively interfere with incoming light waves. By the above method, both the reflectivity and the amplitude of the "swing curve" are minimized. Hence, the process window of the dual damascene process is improved.

The advantages of the method of the present invention are at least fourfold:

(a) The top SiON ARC layer performs as a phase cancellation layer to destructively interfere with incoming light waves.

(b) The bottom SiON ARC layer performs as a light absorption layer to minimize light scattering back from the substrate and substrate features, e.g., vias with critical dimensions (c) The SiON ARC multilayers are made thin and are easily removed by subsequent chem-mech polishing CMP steps in dual damascene processing and do not cause defects in a subsequent critical dimension, via bottom cleaning step by Ar sputter cleaning.

(d) Using relatively thin SiON ARC layers, improves the adhesion of the ARC layers to the intermetal dielectric which is usually an oxide layer. The reduced thickness of the ARC layers lowers the overall intrinsic stress and stress caused by thermal coefficient of expansion mismatch. The thin ARC layers act a "skin" on the intermetal dielectric and are "pinned" to the surface.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include:

FIG. 1, which in cross-sectional representation illustrates a Prior Art method whereby an ARC, anti-reflection coating is formed using a single thick layer of SiON.

FIG. 2, which in cross-sectional representation illustrates the method of the present invention wherein an ARC, anti-reflection coating is formed using a dual dielectric with relatively thin layers of SiON, utilizing different dielectric constants and refractive indices.

DESCRIPTION OF THE PREFERRED EMBODIMENTS

This invention relates to a method of fabrication used for semiconductor integrated circuit devices, and more specifically, to improve the photolithography processing window in a multi-layered dual damascene process by using a dielectric anti-reflection coating, DARC, comprised of multiple layers of SiON with varying k, dielectric constant values and thickness, to reduce reflectivity and improve light absorption. By varying both the thickness and the dielectric constant of the layers, the optical properties of light absorption, refractive indices, and light reflection are optimized.

FIG. 1, which in cross-sectional representation illustrates a Prior Art method whereby an ARC, anti-reflection coating is formed using a single thick layer of SiON (14). A layer of exposed and developed photoresist (16) is sketched with patterned via opening (180) that is used to define a via opening or cavity (181, arrow) in the intermetal dielectric, IMD (12). In subsequent etching steps, a via opening or cavity (181, arrow) is formed by removing intermetal dielectric (12) in the via region (181), as outlined by the dash lines (182). The intermetal dielectric (12) is over a substrate (10). Over the substrate (10) is a thin layer of SiN (11), silicon nitride, approximately 300 Angstroms thick, that acts an etch-stop layer below the intermetal dielectric IMD layer (12). The convention Prior Art process was optimized by simulating Reflectivity versus SiON film thickness, and varying k values. This process was optimized by this method and the results showed the following optimum setting: k value of 0.4, and a single SiON ARC film thickness of 1200 Angstroms. This thickness helps solve via induced metal bridging but led to particle problems, due to the difficulty in removing the thick SiON layer.

Again with reference to FIG. 1, the disadvantages of this Prior Art method are threefold:
(a) The SiON ARC (14) must be made thick to absorb the incident UV exposure light and reflections, for example, from via features below the intermetal dielectric layer (12) cause photoresist exposure problems with critical dimension features.
(b) The thick SiON ARC (14) is difficult to remove in subsequent chem-mech polishing, CMP, steps in dual damascene processing.
(c) Difficulty in removing the thick SiON ARC (14) causes defects in a subsequent critical dimension, via bottom cleaning step by Ar sputter cleaning.

FIG. 2, which in cross-sectional representation illustrates the method of the present invention wherein an ARC, anti-reflection coating is formed using a dual dielectric with relatively thin layers of SiON, utilizing different dielectric constants and refractive indices. Key to the present invention is a multilayer film scheme for a dielectric anti-reflective coating, DARC, comprised of firstly a bottom layer of silicon oxynitride, SiON, (23) is deposited over an intermetal dielectric IMD (22) and the SiON has a dielectric constant k value from approximately 1.0 to 1.4, with the layer thickness from approximately 300 to 500 Angstroms. This bottom layer performs as a light absorption layer to minimize light scattering back from the semiconductor single crystal substrate (20) or IC module, and substrate features that contain integrated circuit elements, e.g., vias with critical dimensions or a metal layer (not shown in Figs.). Secondly, the multi-layer anti-reflective coating is comprised of a top layer of silicon oxynitride, SiON, (24) deposited over the bottom layer of SiON (23), and the top SiON layer (24) has a dielectric constant k value from approximately 0.3 to 0.6, with a layer thickness from approximately 200 to 500 Angstroms. This top layer (24) performs as a phase cancellation layer to destructively interfere with incoming light waves. The combined anti-reflective coating layers form a total thickness from approximately 500 to 1,000 Angstroms, and form a "quarter-wavelength" silicon oxynitride film light absorber. Over the substrate (20) is a thin layer of SiN (21), silicon nitride, with a nominal thickness of approximately 300 Angstroms and thickness range from approximately 100 to 500 Angstroms, that acts an etch-stop layer below the intermetal dielectric IMD layer (22). The intermetal dielectric IMD layer (22) is comprised of a low dielectric constant insulating material for intermetal dielectric layers and is selected from the group consisting of fluorine doped silicon dioxide, FSG, fluorine doped poly-silicon glass or combination of the above, with a thickness of approximately 9,000 Angstroms. Note, not shown in the Figures are some of the "conventional processing layers" used in a dual damascene built. However, the key components described above are the central elements of the present invention. By the above method, both the reflectivity and the amplitude of the "swing curve" are minimized. Hence, the photo-lithographic process window and critical dimensions of a dual damascene process are improved.

Note, the new and unusually good results of using the method of the present invention were discovered by many computer simulations of reflectivity versus film thickness and by varying film k, dielectric constant which is directly related to n, refractive index. These anti-reflective coatings with varying dielectric constants were deposited by chemical vapor deposition, CVD. In addition, many DOE, design of experiments, were performed with actual via patterned wafers, to measure the affect of the via pattern. Hence, the process or method of this invention was optimized by simulating Reflectivity versus SiON Film Thickness, for both single and dual SiON ARC films with varying k values. Good results were noted by using dual ARC films, see FIG. 2, 23 and 24, both consisting of SiON and both with a film or layer thick of approximately 400 Angstroms, for a total ARC thickness of approximately 800 Angstroms. The first layer of SiON (23), see FIG. 2, has an optimum k value of approximately 1.0 and the second layer of SiON (24) has an optimum k value of approximately 0.3. These ARC layers of only 800 Angstroms (<1000 Angstroms) are not too thick to be easily removed by a subsequent chem-mech polishing CMP step, thus solving any residual ARC particle problems. In addition, the new ARC process disclosed provide for a stable photolithography process with a large process window and less "rework margin" in this area. The new ARC process was also shown by experimentation to solve a critical dimension via induced metal bridging problem, metal bridging being a common problem with dual damascene processes. Prior to dual damascene metal processing, "missing metal" was a common problem with subtractive etch processes.

With reference to FIG. 2, sketched are the exposed and patterned via photoresist layer (26) over the ARC layers 23 and 24. The via photoresist and subsequent trench photoresist is top surface imaging photoresist, TSI, with an approximate thickness of 5,000 Angstroms and is exposed using ultraviolet light of 248 nm wavelength. A layer of exposed and developed photoresist (26) is sketched with patterned via opening (280) that is used to define a via opening or cavity (281, arrow) in the intermetal dielectric, IMD (22). In subsequent etching steps, a via opening or cavity (281, arrow) is formed by removing a portion intermetal dielectric (22) in the via region (281) outlined by the dash lines (282). The intermetal dielectric (22), which is over a substrate (20), also may contain an optional trench "inter-etch-stop" layer (290). In a subsequent photolithography processing step for a dual damascene process, a trench opening or cavity (291) is defined and formed by removing a portion intermetal dielectric (22) in the trench region (291, arrows), as outlined by the dash lines (292). Note, the anti-reflective coatings (23) and (24) remain in place for both via and trench photolithography patterning for a dual damascene trench/via process.

Those skilled in the art know well the following process steps that follow the patterning of the above layers, such as, the removal of the exposed regions of the first and second anti-reflection coating layers, and subsequent selective removal of exposed regions of the intermetal dielectric layer (IMD). The above process is repeated for dual damascene processing to form both via and trench openings, for trench/via openings.

The single or multi-step etching for removal of exposed intermetal dielectric, IMD, is comprised of a reactive ion etch (RIE) or plasma assisted dry etching, with an etch chemistry selected from the group consisting of, one or more gases from the following: oxygen, nitrogen, hydrogen, chlorine, chlorine substituted hydrocarbons, forming gas (mixtures of nitrogen and hydrogen gas), fluorine, fluorine substituted hydrocarbons, boron trichloride, argon and helium and stopping on an etch-stop layer.

Next, the patterned photoresist is then stripped along with anti-reflection layers, and the subsequent trench/via openings are filled with copper, approximately 1.3 microns thick, with diffusion barriers, form to connect line and contact vias to the underlying substrate. The formation of these inlaid line/contacts is performed by patterning and polishing back, by chem-mech polishing (CMP), the excess metal on the surface and, at the same time, CMP planarizes the surface. Also, it is well know that the above process steps can be repeated (after stud metal, e.g., W and the first layer of copper is polished back), to add additional metal layers to this dual damascene interconnect line and contact via process. The excess metal can be removed by milling, ion milling, etch, in addition to chem-mech polish.

With reference to FIG. 2 again, the advantages of the method of the present invention are at least fourfold:
(a) The top SiON ARC layer (24) performs as a phase cancellation layer to destructively interfere with incoming light waves.
(b) The bottom SiON ARC layer performs as a light absorption layer to minimize light scattering back from the substrate (20) and substrate features, e.g., vias with critical dimensions
(c) The SiON ARC multilayers (23) and (24) are made thin and are easily removed by subsequent chem-mech polishing CMP steps in dual damascene processing and do not cause defects in a subsequent critical dimension, via bottom cleaning step by Ar sputter cleaning.
(d) Using relatively thin SiON ARC layers, improves the adhesion of the ARC layers to the intermetal dielectric (22) which is usually an oxide layer. The reduced thickness of the ARC layers lowers the overall intrinsic stress and stress caused by thermal coefficient of expansion mismatch. The thin ARC layers act a "skin" on the intermetal dielectric (22) and are "pinned" to the surface.

While the invention has been particularly shown and described with reference to the preferred embodiments thereof, it will be understood by those skilled in the art that various changes in form and details may be made without departing from the spirit and scope of the invention.

What is claimed is:

1. A method of improving photolithography patterning process in a damascene process, by use of anti-reflective coating layers, the method comprising:
    forming an etch-stop layer over an underlying semiconductor substrate that contains integrated circuit elements or over a metal layer;
    forming an intermetal dielectric layer over the etch-stop layer;
    forming a first anti-reflection coating layer on the intermetal dielectric layer;
    forming a second anti-reflection coating layer on the first anti-reflection coating layer;
    forming a layer of photoresist on the second anti-reflection coating layer;
    exposing selected regions of the photoresist layer to ultraviolet light using a photo mask to form exposed regions and unexposed regions;
    removing the exposed selected regions of the photoresist layer by developing, thus providing a patterned photoresist mask for subsequent selective removal of exposed regions of the first and second anti-reflection coating layers, and for subsequent selective removal of exposed regions of the intermetal dielectric layer forming a via opening.

2. The method of claim 1, wherein said substrate is a semiconductor single crystal or an IC module, the substrate contain integrated circuit elements.

3. The method of claim 1, wherein said etch-stop layer is comprised of silicon nitride with a nominal thickness of approximately 300 Angstroms with a thickness range from approximately 100 to 500 Angstroms and is used as an etch stop in the selective etch for trench and via openings, used in forming subsequent interconnect line and contact vias.

4. The method of claim 1, wherein the low dielectric constant insulating material for intermetal dielectric layers is selected from the group consisting of fluorine doped silicon dioxide, FSG, fluorine doped poly-silicon glass or combination of the above, with a thickness of approximately 9,000 Angstroms.

5. The method of claim 1, wherein said first anti-reflective coating is selected from the group consisting of silicon oxynitride, SiON, with a dielectric constant, k from 1.0 to 1.4, with an approximate thickness from approximately 300 to 500 Angstroms, deposited by chemical vapor deposition, CVD.

6. The method of claim 1, wherein said second anti-reflective coating is selected from the group consisting of silicon oxynitride, SiON, with a dielectric constant, k from 0.3 to 0.6, with an approximate thickness from approximately 200 to 500 Angstroms, deposited by chemical vapor deposition, CVD.

7. The method of claim 1, wherein the two layers of anti-reflective coating, first and second coating, form a bottom and top layer form, with the first anti-reflective coating, bottom layer with dielectric constant k from approximately 1.0 to 1.4 "high k" and thickness from approximately 300 to 500 Angstroms, and the second anti-reflective coating, top layer with dielectric constant k from 0.3 to 0.6 "low k" and thickness from approximately 200 to 500 Angstroms, and with total thickness of the two layers combined comprising approximately 500 to 1,000 Angstroms in thickness, forming a "quarter-wavelength" silicon oxynitride film light absorber.

8. The method of claim 1, wherein said photoresist is comprised of top surface imaging photoresist, TSI, with an approximate thickness of 5,000 Angstroms and is exposed using ultraviolet light of 248 nm wavelength.

9. The method of claim 1, whereby subsequent selective removal of exposed regions of the intermetal dielectric layer is by a single or multi-step etch comprised of a reactive ion etch (RIE) or plasma assisted dry etching, with an etch chemistry selected from the group consisting of, one or more gases from the following: oxygen, nitrogen, hydrogen, chlorine, chlorine substituted hydrocarbons, forming gas mixtures of nitrogen and hydrogen gas, fluorine, fluorine substituted hydrocarbons, boron trichloride, argon and helium stopping on an etch-stop layer.

10. A method of improving photolithography patterning process in a dual damascene process to improve the processing window by use of anti-reflective coating layers, the method comprising:

forming an etch-stop layer of silicon nitride over an underlying semiconductor substrate that contains integrated circuit elements;

forming an intermetal dielectric layer of fluorine doped poly-silicon glass over the etch-stop layer;

forming a first anti-reflection coating layer of silicon oxynitride, bottom layer, on the intermetal dielectric layer;

forming a second anti-reflection coating layer of silicon oxynitride, top layer, on the first anti-reflection coating layer;

forming a layer of via photoresist on the second anti-reflection coating layer;

exposing selected regions of the via photoresist layer to ultraviolet light using a via photo mask to form exposed regions and unexposed regions;

removing the exposed selected regions of the via photoresist layer by developing and providing a patterned via photoresist mask for subsequent selective removal of exposed regions;

removing exposed regions of the first and second anti-reflection coating layers;

removing exposed regions of the intermetal dielectric layer to form via openings;

stripping the via photoresist;

forming a layer of trench photoresist on the second anti-reflection coating layer;

exposing selected regions of the trench photoresist layer to ultraviolet light using a trench photo mask to form exposed regions and unexposed regions;

removing the exposed selected regions of the trench photoresist layer by developing and providing a patterned trench photoresist mask for subsequent selective removal of exposed regions;

removing exposed regions of the first and second anti-reflection coating layers;

removing exposed regions of the intermetal dielectric layer to form trench openings and trench/via openings;

stripping the trench photoresist;

filling the trench/via openings with metal;

removing the excess metal on the surface and planarizing the surface to form inlaid metal interconnect lines and contact vias, in a dual damascene process.

11. The method of claim 10, wherein said substrate is semiconductor single crystal or an IC module, the substrate contain integrated circuit elements.

12. The method of claim 10, wherein, wherein said etch-stop layer is comprised of silicon nitride with a nominal thickness of approximately 300 Angstroms with a thickness range from approximately 100 to 500 Angstroms and is used as an etch stop in the selective etch for trench and via openings, used in forming subsequent interconnect line and contact vias.

13. The method of claim 10, wherein the low dielectric constant insulating material for intermetal dielectric layers is selected from the group consisting of fluorine doped silicon dioxide, FSG, fluorine doped poly-silicon glass or combination of the above, with a thickness of approximately 9,000 Angstroms.

14. The method of claim 10, wherein said first anti-reflective coating is selected from the group consisting of silicon oxynitride, SiON, with a dielectric constant, k from 1.0 to 1.4, with an approximate thickness from approximately 300 to 500 Angstroms, deposited by chemical vapor deposition, CVD.

15. The method of claim 10, wherein said second anti-reflective coating is selected from the group consisting of silicon oxynitride, SiON, with a dielectric constant, k from 0.3 to 0.6, with an approximate thickness from approximately 200 to 500 Angstroms, deposited by chemical vapor deposition, CVD.

16. The method of claim 10, wherein the two layers of anti-reflective coating, first and second coating, form a bottom and top layer form, with the first anti-reflective coating, bottom layer with dielectric constant k from approximately 1.0 to 1.4 "high k" and thickness from approximately 300 to 500 Angstroms, and the second anti-reflective coating, top layer with dielectric constant k from 0.3 to 0.6 "low k" and thickness from approximately 200 to 500 Angstroms, and with total thickness of the two layers combined comprising approximately 500 to 1,000 Angstroms in thickness, forming a "quarter-wavelength" silicon oxynitride film light absorber.

17. The method of claim 10, wherein said photoresist is comprised of top surface imaging photoresist, TSI, with an approximate thickness of 5,000 Angstroms and is exposed using ultraviolet light of 248 nm wavelength.

18. The method of claim 10, whereby subsequent selective removal of exposed regions of the intermetal dielectric layer is by a single or multi-step etch comprised of a reactive ion etch (RIE) or plasma assisted dry etching, with an etch chemistry selected from the group consisting of, one or more gases from the following: oxygen, nitrogen, hydrogen, chlorine, chlorine substituted hydrocarbons, forming gas mixtures of nitrogen and hydrogen gas, fluorine, fluorine substituted hydrocarbons, boron trichloride, argon and helium stopping on an etch-stop layer.

19. The method of claim 10, wherein the trench/via for dual damascene to form for interconnect line and contact via is filled with copper, approximately 1.3 microns thick, and lined with a diffusion barrier.

20. The method of claim 10, whereby the first and second anti-reflection coating and the copper metal are removed from the surface and planarized by subsequent removal steps selected from the group consisting of chem-mech polish, milling, ion milling, or etching.

21. A method of improving photolithography patterning process in a dual damascene process to improve the photolithography processing window by use of anti-reflective coating layers with an exposure wavelength of 248 nanometers, the method comprising:

forming an etch-stop layer of silicon nitride over an underlying semiconductor substrate that contains integrated circuit elements;

forming an intermetal dielectric layer of fluorine doped poly-silicon glass over the etch-stop layer;

forming a first anti-reflection coating layer of silicon oxynitride, bottom layer, on the intermetal dielectric layer;

forming a second anti-reflection coating layer of silicon oxynitride, top layer, on the first anti-reflection coating layer;

forming a layer of 5,000 Angstroms thick via photoresist on the second anti-reflection coating layer;

exposing selected regions of the via photoresist layer to ultraviolet light, wavelength 248 nanometers, using a via photo lith mask to form exposed regions and unexposed regions;

removing the exposed selected regions of the via photoresist layer by developing, hardening and this provides a patterned via photoresist mask for subsequent selective removal of exposed regions;

removing exposed regions of the first and second anti-reflection coating layers;

removing exposed regions of the intermetal dielectric layer to form via openings;

stripping the via photoresist;

forming a layer of 5,000 Angstroms thick trench photoresist on the second anti-reflection coating layer;

exposing selected regions of the trench photoresist layer to ultraviolet light, wavelength 248 nanometers, using a trench photo lith mask to form exposed regions and unexposed regions;

removing the exposed selected regions of the trench photoresist layer by developing, hardening and this provides a patterned trench photoresist mask for subsequent selective removal of exposed regions;

removing exposed regions of the first and second anti-reflection coating layers;

removing exposed regions of the intermetal dielectric layer to form trench openings and trench/via openings;

stripping the trench photoresist;

filling the trench/via openings with copper metal;

removing the excess copper metal on the surface and planarizing the surface to form inlaid copper metal interconnect lines and contact vias.

22. The method of claim 21, wherein said substrate is semiconductor single crystal or an IC module, the substrate contain integrated circuit elements.

23. The method of claim 21, wherein said etch-stop layer is comprised of silicon nitride with a nominal thickness of approximately 300 Angstroms with a thickness range from approximately 100 to 500 Angstroms and is used as an etch stop in the selective etch for trench and via openings, used in forming subsequent interconnect line and contact vias.

24. The method of claim 21, wherein the low dielectric constant insulating material for intermetal dielectric layers is selected from the group consisting of fluorine doped silicon dioxide, FSG, fluorine doped poly-silicon glass or combination of the above, with a thickness of approximately 9,000 Angstroms.

25. The method of claim 21, wherein said first anti-reflective coating is selected from the group consisting of silicon oxynitride, SiON, with a dielectric constant, k from 1.0 to 1.4, with an approximate thickness from approximately 300 to 500 Angstroms, deposited by chemical vapor deposition, CVD.

26. The method of claim 21, wherein said second anti-reflective coating is selected from the group consisting of silicon oxynitride, SiON, with a dielectric constant, k from 0.3 to 0.6, with an approximate thickness from approximately 200 to 500 Angstroms, deposited by chemical vapor deposition, CVD.

27. The method of claim 21, wherein the two layers of anti-reflective coating, first and second coating, form a bottom and top layer form, with the first anti-reflective coating, bottom layer with dielectric constant k from approximately 1.0 to 1.4 "high k" and thickness from approximately 300 to 500 Angstroms, and the second anti-reflective coating, top layer with dielectric constant k from 0.3 to 0.6 "low k" and thickness from approximately 200 to 500 Angstroms, and with total thickness of the two layers combined comprising approximately 500 to 1,000 Angstroms in thickness, forming a "quarter-wavelength" silicon oxynitride film light absorber.

28. The method of claim 21, wherein said photoresist is comprised of top surface imaging photoresist, TSI, with an approximate thickness of 5,000 Angstroms and is exposed using U ultraviolet light of 248 nm wavelength.

29. The method of claim 21, whereby subsequent selective removal of exposed regions of the intermetal dielectric layer is by a single or multi-step etch comprised of a reactive ion etch (RIE) or plasma assisted dry etching, with an etch chemistry selected from the group consisting of, one or more gases from the following: oxygen, nitrogen, hydrogen, chlorine, chlorine substituted hydrocarbons, forming gas mixtures of nitrogen and hydrogen gas, fluorine, fluorine substituted hydrocarbons, boron trichloride, argon and helium stopping on an etch-stop layer.

30. The method of claim 21, wherein the trench/via for dual damascene to form for interconnect line and contact via is filled with copper, approximately 1.3 microns thick, and lined with a diffusion barrier.

31. The method of claim 21, whereby the first and second anti-reflection coating and the copper metal are removed from the surface and planarized by subsequent removal steps selected from the group consisting of chem-mech polish, milling, ion milling, or etching.

* * * * *